US005806082A

United States Patent [19]
Shaw

[11] Patent Number: 5,806,082
[45] Date of Patent: *Sep. 8, 1998

[54] WRAP-AROUND MECHANISM FOR MEMORY SPLIT-WORDLINE READ

[75] Inventor: Jeng-Jye Shaw, Palo Alto, Calif.

[73] Assignee: Intel Corporation, Santa Clara, Calif.

[*] Notice: The term of this patent shall not extend beyond the expiration date of Pat. No. 5,574,880.

[21] Appl. No.: 698,055

[22] Filed: Aug. 13, 1996

Related U.S. Application Data

[63] Continuation of Ser. No. 212,136, Mar. 11, 1994, Pat. No. 5,574,880.

[51] Int. Cl.$^6$ .......................... G06F 12/06; G11C 11/407
[52] U.S. Cl. .................. 711/104; 711/154; 365/230.03; 365/230.06
[58] Field of Search ..................... 395/403, 405, 395/411, 431, 481; 365/230.03, 230.06, 238.5; 345/200, 201; 711/3, 5, 201, 104, 154

[56] References Cited

U.S. PATENT DOCUMENTS 5,257,235 10/1993 Miyamoto .................. 365/230.03

*Primary Examiner*—Eddie P. Chan
*Assistant Examiner*—Kevin L. Ellis
*Attorney, Agent, or Firm*—Blakely, Sokoloff, Taylor & Zafman

[57] ABSTRACT

A memory with at least two banks, each bank capable of storing $N=2^n$ unique lines of data, each line of data addressable by an n-bit code corresponding to an address index i, $0 \leq i \leq N-1$, provides for operation in either an OR-line or split-line mode. In the OR-line mode, data from line i, corresponding to index i, is available from all banks. In the split-line mode, data is available from line address i of one set of banks, and address i+1 from another set of banks. In either mode, wrap-around from line address i=N-1 to i=0 is provided by the use of an additional line of memory located at a position corresponding to i=N that contains the same data as the line corresponding to i=0. In this manner, a complete wrap-around read capability is provided without suffering a memory speed loss.

21 Claims, 8 Drawing Sheets

| INPUT | | | | OUTPUT | | | | | | | | | |
|---|---|---|---|---|---|---|---|---|---|---|---|---|---|
| LINE ADR CODE | | | | ADDRESS LINE STATE | | | | | | | | | |
| c | n | | | 0 | 1 | 2 | 3 | 4 | 5 | 6 | 7 | 8 | |
| 0 | 0 | 0 | 0 | 1 | | | | | | | | | |
| 0 | 0 | 0 | 1 | | 1 | | | | | | | | |
| 0 | 0 | 1 | 0 | | | 1 | | | | | | | |
| 0 | 0 | 1 | 1 | | | | 1 | | | | | | |
| 0 | 1 | 0 | 0 | | | | | 1 | | | | | |
| 0 | 1 | 0 | 1 | | | | | | 1 | | | | |
| 0 | 1 | 1 | 0 | | | | | | | 1 | | | |
| 0 | 1 | 1 | 1 | | | | | | | | 1 | | |
| 1 | 0 | 0 | 0 | 1 | | | | | | | | | |
| 1 | 0 | 0 | 1 | | 1 | | | | | | | | |
| 1 | 0 | 1 | 0 | | | 1 | | | | | | | |
| 1 | 0 | 1 | 1 | | | | 1 | | | | | | |
| 1 | 1 | 0 | 0 | | | | | 1 | | | | | |
| 1 | 1 | 0 | 1 | | | | | | 1 | | | | |
| 1 | 1 | 1 | 0 | | | | | | | 1 | | | |
| 1 | 1 | 1 | 1 | | | | | | | | 1 | | |

WRAP-AROUND MECHANISM FOR MEMORY SPLIT-WORDLINE READ

This is a continuation of application Ser. No. 08/212,136, filed Mar. 11, 1994, which issued as U.S. Pat. No. 5,574,880.

FIELD OF THE INVENTION

This invention relates to addressing of a random access memory (RAM). A memory structure avoids special addressing provisions at a RAM edge by providing a novel wrap-around capability without sacrificing memory read bandwidth for use in computer systems with a tendency for sequentially ordered stored instructions and data.

BACKGROUND OF THE INVENTION

Many computer systems exhibit a propensity to access instructions and data from selected regions of memory in a highly sequential order. If a memory boundary should fall within such a region resulting in data wrap-around from the highest memory address to the lowest, the natural sequence of addressing by increments is destroyed. Thus, the accessing of the upper address followed by the lowest address requires the introduction of special conditions to the memory accessing procedure causing decreased efficiency in the utilization of memory.

For example, modern microprocessor chips often contain an on-chip cache memory for instruction and data in order to increase the effective memory bandwidth of a bulk storage main memory system.

The increase in apparent bandwidth of the slower bulk storage mean memory is achieved by taking advantage of a characteristic that is generally found in instruction programs, namely: most references to memory, particularly over a short interval of time, tend to access certain memory neighborhoods of instruction memory. These neighborhoods, or reference localities, tend to move about as the program progresses. By storing these reference localities in a fast cache memory, the apparent speed (bandwidth) of memory can be increased by virtue of the reduced access time. From time to time, new reference localities must be transferred from bulk storage to cache as the pertinent reference locality shifts in the bulk storage main memory or when jumps must be made to accommodate subroutines, for example. Whenever, a required instruction program segment is not found in cache memory, an access must be made to main memory and the pertinent data transferred to cache. This new pertinent data generally displaces an older segment.

FIG. 1 shows a typical memory map from a main memory to a cache memory as used in a virtual memory system. FIG. 1(a) shows the accessible bulk memory segmented into $2^N$ pages. Each page may typically be 2 or 4 B (bytes) wide and 1 or 2 KB deep. The relative beginning address of each page is indicated to the left.

FIG. 1(b) shows a cache memory map for a cache memory having a capacity to store an integer number of pages, in which pages m and m+1 are stored in the page locations indicated by the solid arrows emanating from main memory. The two pages, shown as being transferred to contiguous locations in cache memory, in the general case, may be stored in any order. However, it is not uncommon for the reference locality to be located in adjacent pages as indicated by the shaded regions of page m and m+1 so that it is desirable to store contiguous main memory pages in contiguous segments of cache memory in order to simplify addressing of cache memory by its associated microprocessor (CPU). FIG. 1(c) shows a common situation in which page m is stored at the upper edge of cache memory and consequently page m+1 is "rolled-over" into lower memory as shown by the dash lines emanating from the main memory of FIG. 1(b) to cache memory of FIG. 1(c). If this situation occurs, addressing problems arise because of the discontinuity in addresses within the current reference locality. This situation is particularly undesirable when split-wordline read, rather than OR-line read is used as an accessing scheme to cache memory.

FIG. 2 shows a typical 2-bank RAM. Bank-0 comprises a memory unit 20, m-write amplifier unit 22, and m-sense amplifier unit 24. Similarly bank-1 comprises memory unit 21, m write amplifier unit 23, and m-sense amplifier unit 25. Each memory unit (20, 21) has an m-bit wide line and $N=2^n$ lines. The memory units are addressed by an n-bit code $(A_{n-1} A_{n-2} \ldots A_0)$ through line select decoder 10 which has N output lines. The input line code $(A_{n-1} A_{n-2} \ldots A_0)$ designates one-out-of-N of the output lines to be activated, so that the activated line enables a read or write operation to the corresponding line. In this two-bank configuration, a read causes sense amplifier 24 and 25 to read a line from bank-0 and bank-1, respectively, so that either or both outputs may be used.

FIG. 3(a) and (b) shows the logical configuration of a typical line select decoder 10. In FIG. 3(a), input line code terminals $(A_{n-1} A_{n-2} \ldots A_0)$ apply the input line code to a logic array comprising N multiple-input AND-gates, one for each output lines labeled 0 through $2^n-1$. Each AND-gate input 12, designated in FIG. 3 by the x-symbol, has one input for every bit of input line code. Inverter 11 is used to generate the logical complement of each input line code bit. A particular line with binary code index of $(a_{n-1} a_{n-2} \ldots a_0)$, where $a_n$ is a binary bit, is selected to be active by applying a corresponding binary code to input terminals $A_{n-1} A_{n-2} \ldots A_0$ so that line $a_{n-1} a_{n-2} \ldots a_0$ is true high, if, any only if code $a_{n-1} a_{n-2} \ldots a_0$ is applied. For example, line 6 (binary 0 ... 0110) is active when the input code at $A_{n-1} A_{n-2} \ldots A_0$ is 0 ... 0110.

FIG. 3(b) shows a 3-bit line decoder 10 with the multiple input AND-gate 27 shown explicitly for producing 8 fully decoded output lines.

Another useful mode for operating a memory is called the split-line mode. To explain the difference between OR-line and split-line modes, refer to FIG. 2. If the input code corresponds to line i, and the memory is in the read mode, line-select decoder 10, activates line i causing line i to be read from each bank as described above. However, if the memory is being operated as an instruction cache, the split-line operating mode provides a means for reading data from, say, line i of bank-0 and line i+1 of bank-i with a minimum delay. This mode is important because of the important property of locality of memory neighborhoods.

One obvious way to implement a split-line read is to address line i and read, say, bank-0 and then increment the input line-code by one, and then read line i+1 from bank-1. The problem with this method is that the access requires sequential addressing and an incrementing or add-operation with the associated inherent propagation delay due to carries.

In order to achieve maximum effective bandwidth of the memory, a line address decoder of the type shown in FIG. 4 has been used. (It should be noted that in the following example, the memory is limited to 3 bits, or N=8 decoded lines for the sake of clarity in explanation and does not imply a limitation as to size. Extension of the principles to N>8 will be apparent to those practicing the art.) The line decoder 40 is the same as shown previously as decoder 10 of FIG. 3 except that the decoded output lines 0–7 are further operated-on by split line selector 45 which comprises one 2-input selector 13 per output line. One input is connected to the output line, say i of decoder 10, normally associated with its output terminal i, while the other is connected to line i–1 of decoder 10. The output is selected by control line 41 which connects to lower input of each selector 13 when in one state and to the upper input of each selector 13 when the other state. The lower input of the line 0 selector is connected to the i–1=N–1 line (or 7 line in the example shown). Thus, these connections effectively arrange the output to correspond to a modulo-N ring counter by causing (N–1)+1 to be equal to N mod N.

The disadvantage of decoder 40 is that for large memory arrays having in the order of 2K lines (or more), the circuit layout required to accommodate the connection from line N–1 of decoder 10 to the lower input of selector 13 associated with line 0 introduces an undesirably long lead and causes a loss in effective bandwidth as a result.

The present invention is directed to providing both OR-line and split-line cache memory operation without the limitations described above.

SUMMARY OF THE INVENTION

It is the object of the current invention to provide a means for providing a cache memory system where contents are addressable in an OR-line or split-line mode and to provide a wrap-around addressing mode without any penalty in memory read bandwidth.

BRIEF DESCRIPTION OF THE DRAWINGS

The present invention may be understood more fully from the detailed description given below and from the accompanying drawings of the preferred embodiments of the invention which, however, should not be taken to limit the invention to the specific embodiment but are for explanation and understanding only.

FIG. 8 is a truth table showing the relationship between the line address code applied to line select decoder, the state of the mode control lines, and the state of the decoded output lines.

DESCRIPTION OF THE PREFERRED EMBODIMENT(S)

Although the following description of the invention is based on a memory system having eight lines/bank, it should be recognized that this is being done in order to more clearly described the essence of the invention without introducing unnecessary details. It should be apparent to those of ordinary skill in the art that the principles described may be scaled to accommodate more lines. Similarly, the number of memory banks has been limited because it is sufficient to describe the invention. Scaling of the inventive memory system to accommodate more banks may also be readily accomplished.

Figure 5:
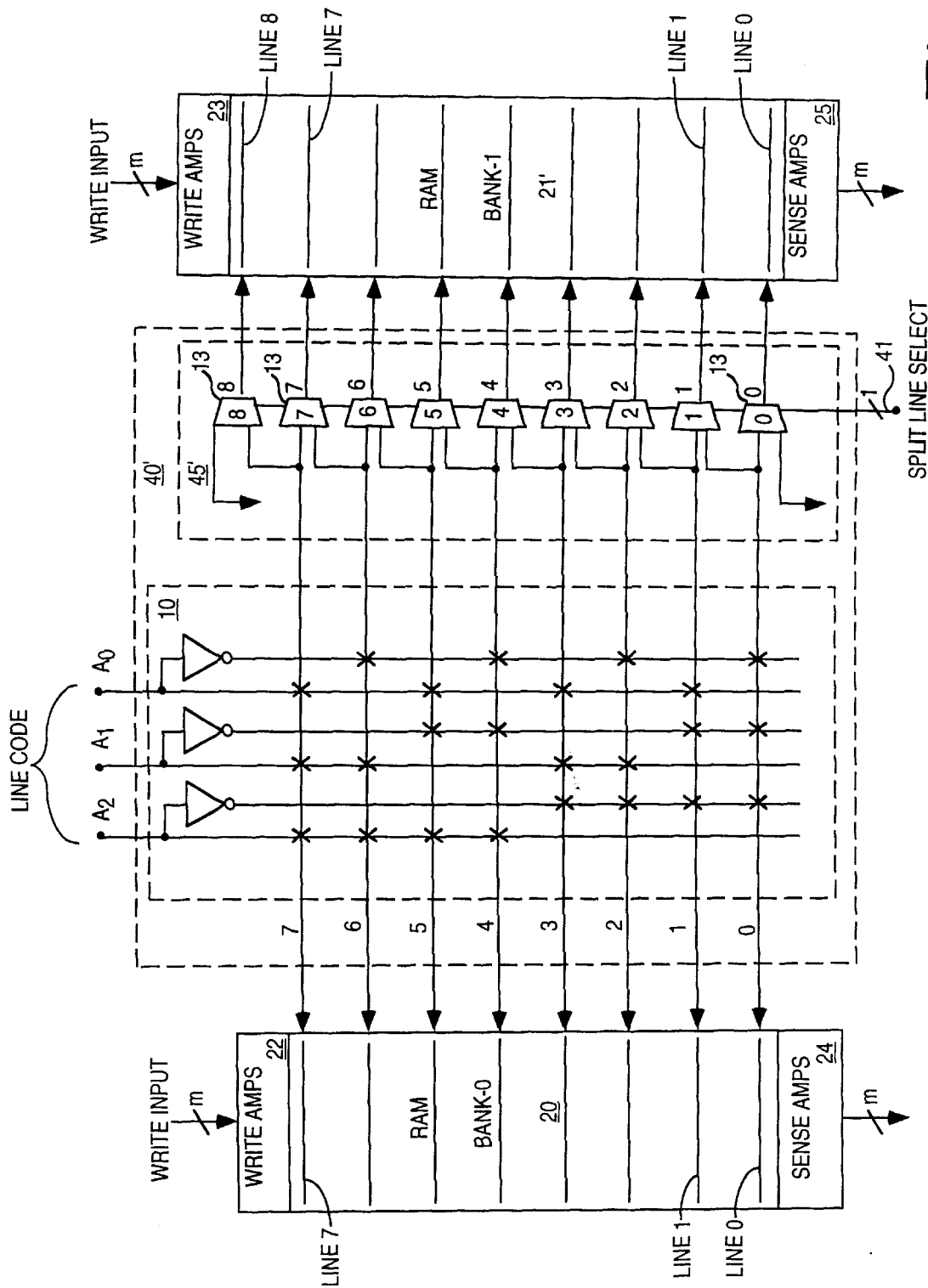
FIG. 5 is a block diagram of a two-bank memory system incorporating both OR-line and split-line read using an N+1 line memory unit.

FIG. 5 shows a 2-bank memory system comprising an address line decoder 40'; and two banks, bank-0 and bank-1. Bank-0 includes an m-bit write amplifier assembly 22, a bank-0 random access memory (RAM) 20 that is m-bits wide and has N=8 lines, and m-bit sense amplifier assembly 24. Bank-1 is similar having write amplifier and sense amplifier assemblies 23 and 25, respectively, and bank-1 RAM 21' having N+1=9 lines, each line being m-bits wide.

Address line decoder 40' includes a line decoder 10, as previously described, that accepts n=3 bits as an address line code on terminals $A_2$, $A_1$, $A_0$, and activates the one-out-N (N=8) lines labeled 0–7. The N output lines are connected directly to bank-0 RAM 20 and indirectly through split-line network 45' to bank-1 RAM 21' via the N+1=9 output lines of split-line network 45' that are labeled 0–8.

Network 45' includes N+1=9 two-input selectors 13 indexed 0–8. Line-decoder 10 output line i connects to the upper input of selector 13, index-i, and the lower input of selector 13, index-i, is connected to output line i–1 of line-decoder 10, except that upper input of selector 13, index-N (N=8), and lower input of selector 13, index-0, is tied to the logic low level. The logic level of binary control line 41 selects the lower input terminal of each selector 13 when in one state and the upper input terminal when in the other state.

Figure 1:
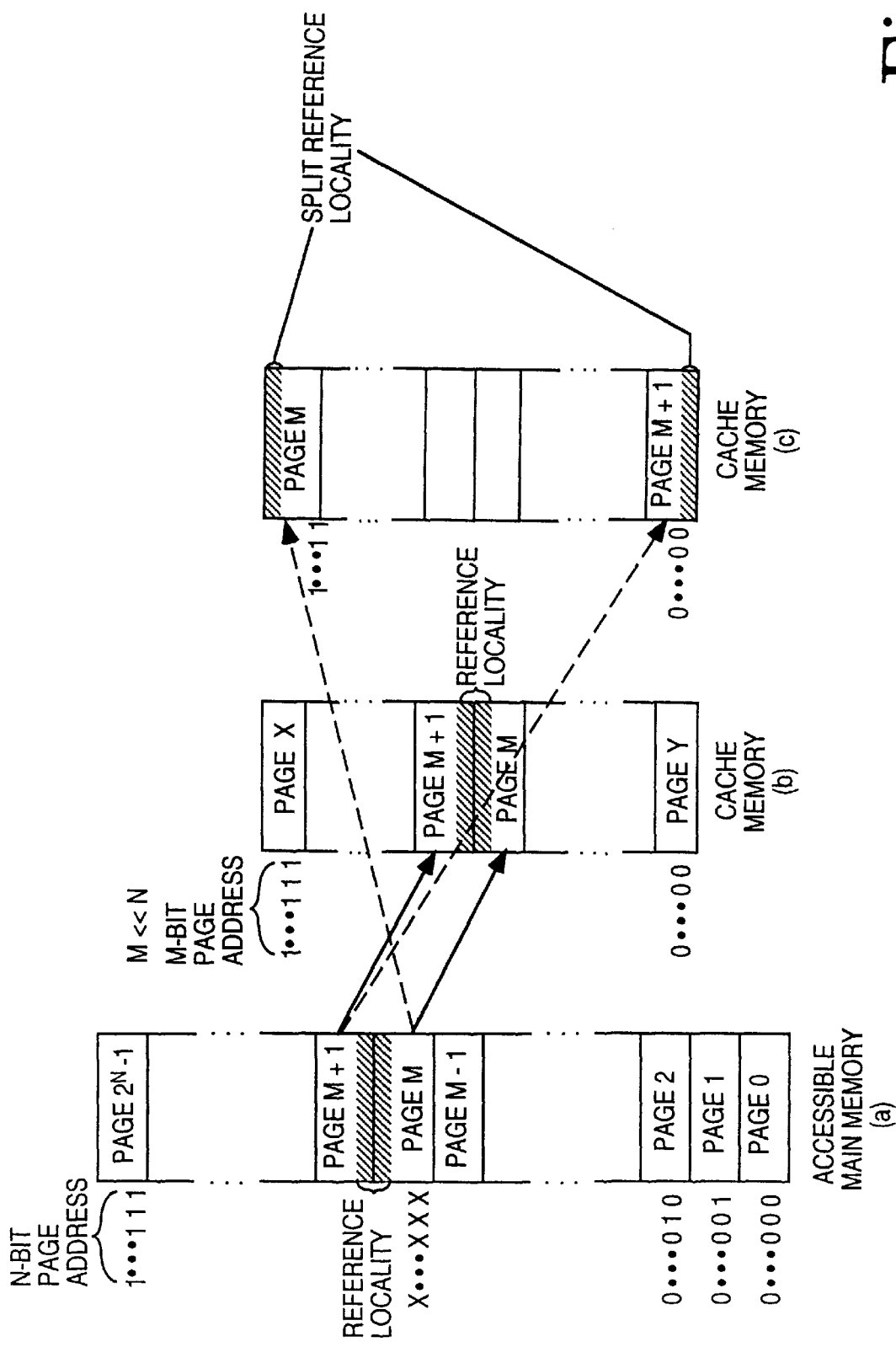
FIG. 1 shows a typical memory mapping from a main memory to a cache memory.
Figure 2:
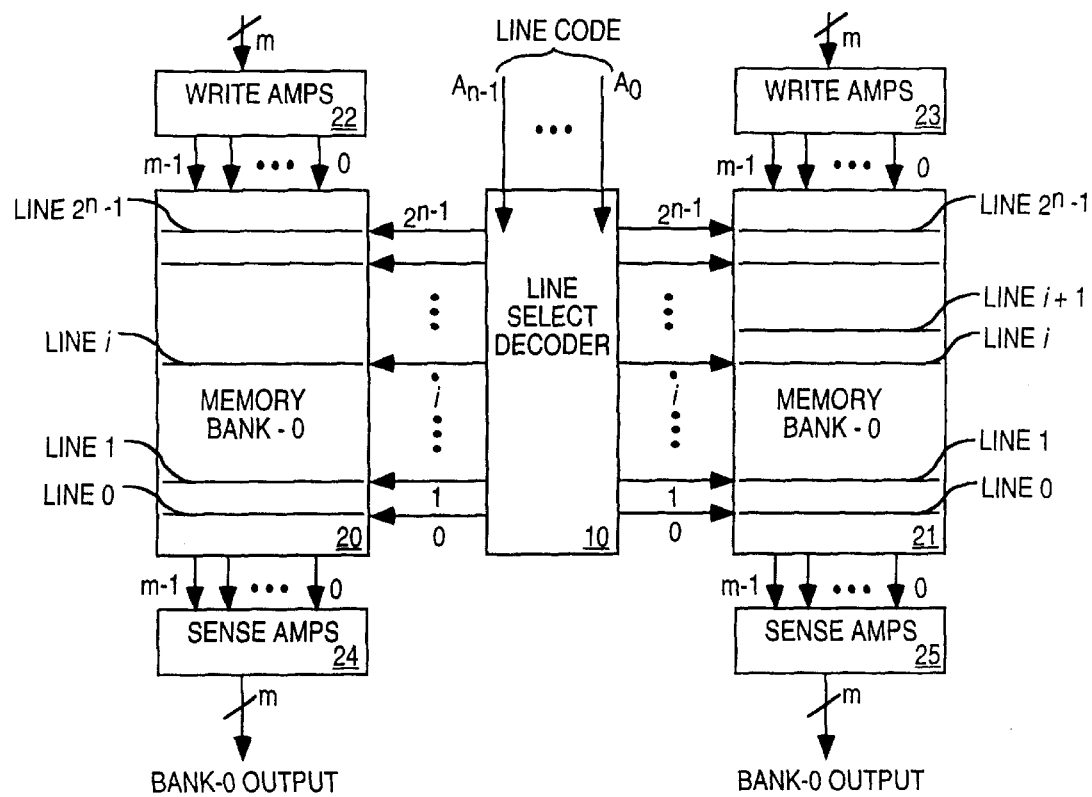
FIG. 2 shows a typical two-bank memory.
Figure 3A:
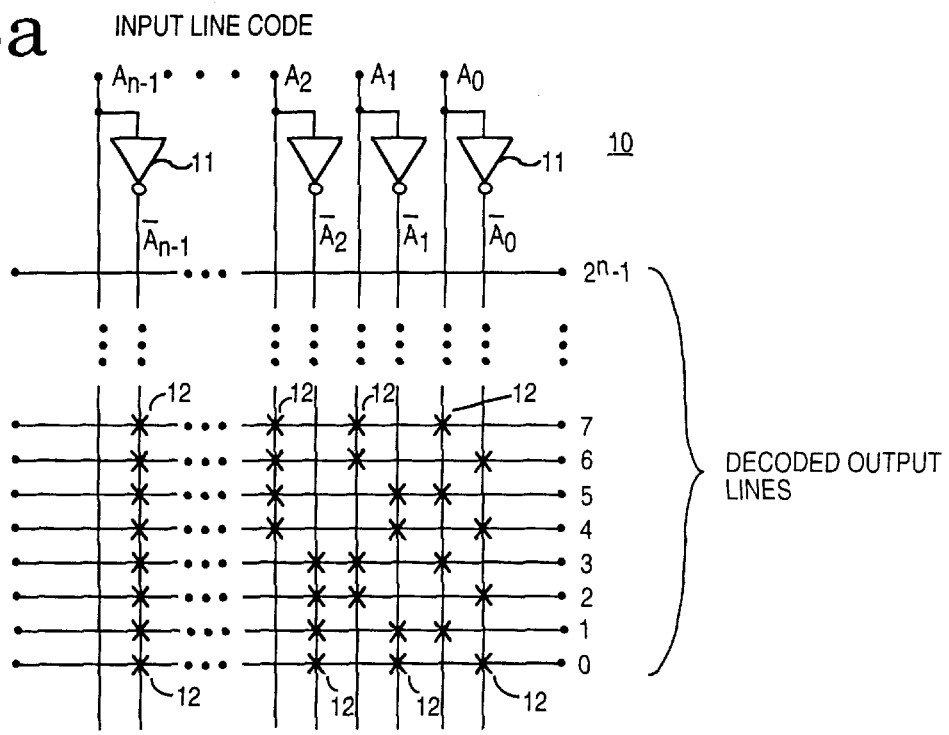
FIG. 3, is a logic diagram of a typical line select decoder.
Figure 3B:
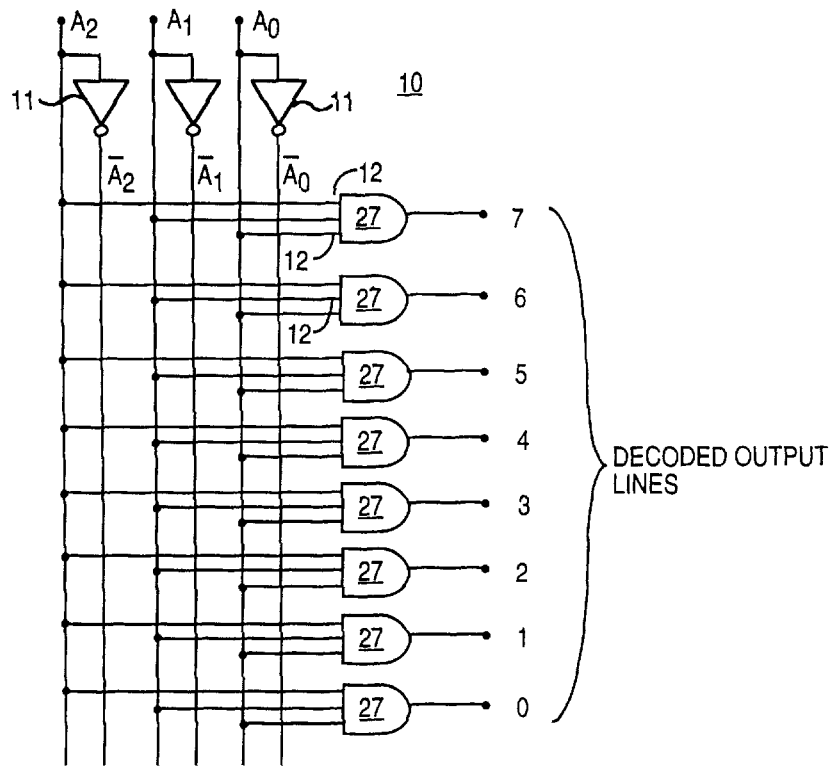

If the memory is to be operated in the OR-line mode, control line 41 selects the upper input of each selector 13. This disables output line 8 of network 45' and the FIG. 5 memory system operates as the full equivalent to that of FIG. 2.

Figure 4:
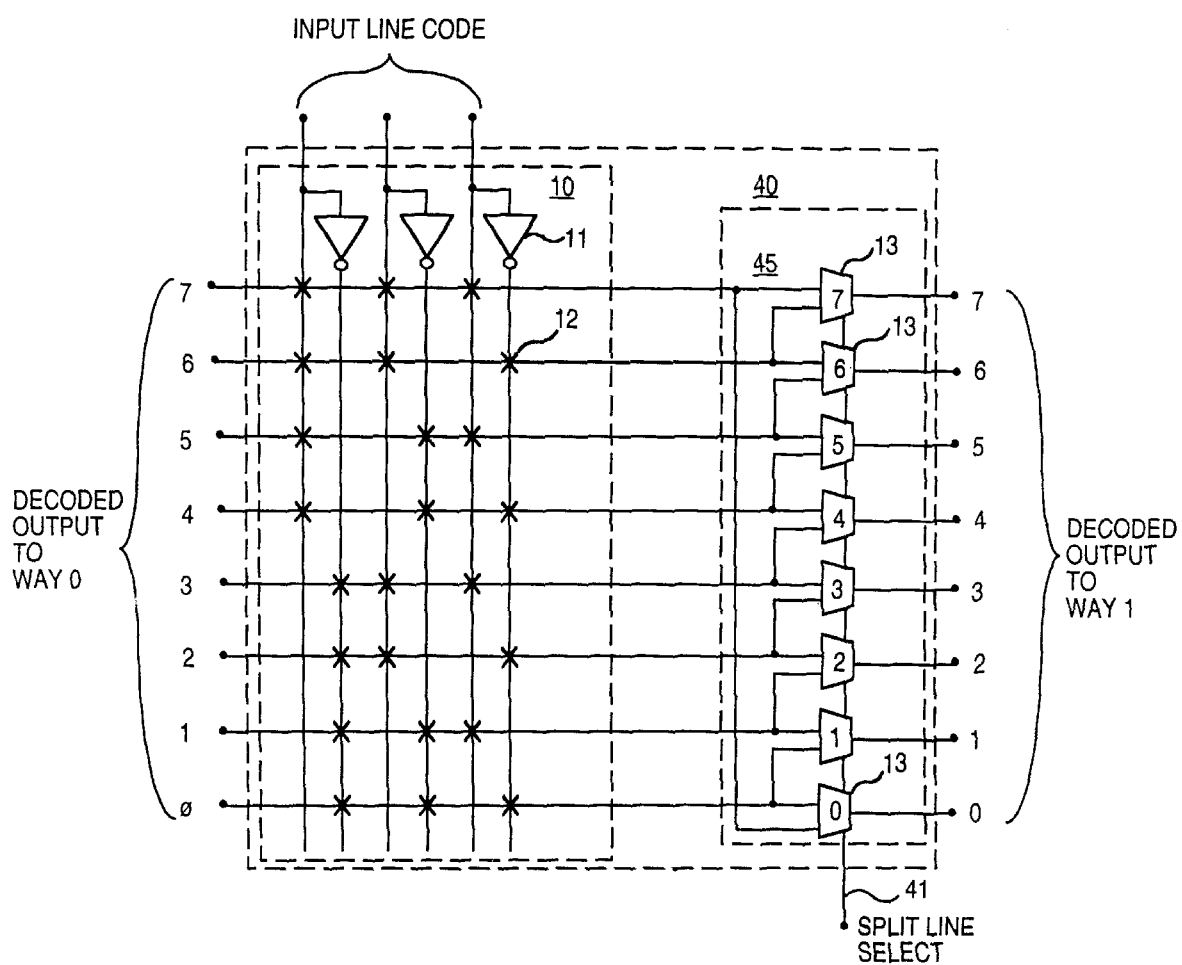
FIG. 4 is a logic diagram of a 3-bit input line decoder with 8-output lines for both OR-line and split line decoding.

If the state of selector control line 41 selects the lower input of each selector 13, the memory system of FIG. 5 operates in the split-line mode, i.e., if line i of decoder 10 is activated, line i of RAM 20 (bank-0) is enabled while line i+1 of RAM 21' (bank-1) is enabled and line 0 of RAM 21' is disabled. If line 8 is made to have the same data stored as line 0, then split-line read is accommodated without introducing a lengthy circularizing connection as in FIG. 4.

This arrangement implies that a write to line 0 of RAM 21' requires an additional write to line N (N=8 in this example). However, complete symmetry of memory access to memory in the split-line mode is maintained.

Figure 6:
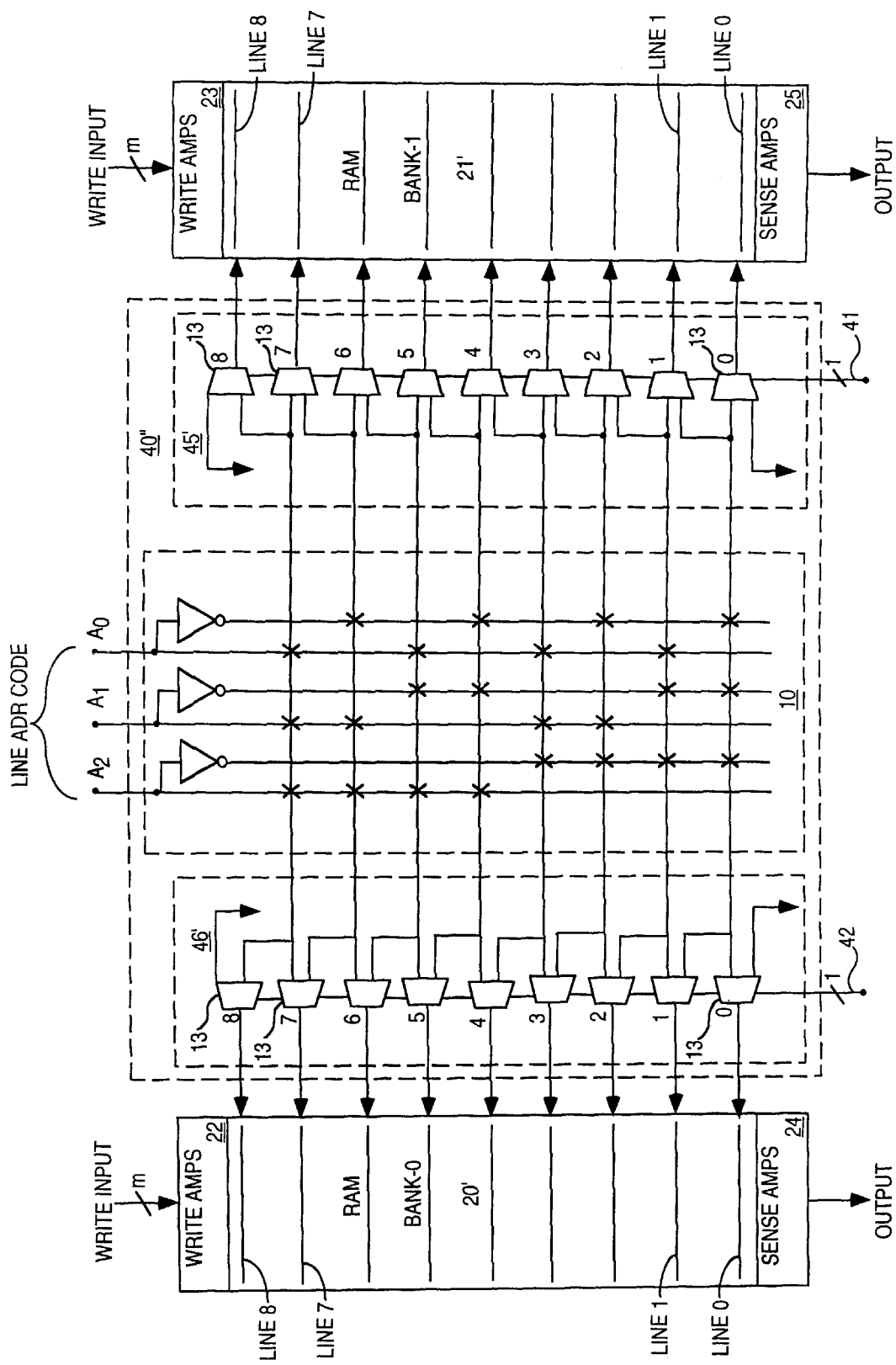
FIG. 6 is another block diagram of a two-bank memory system symmetrically incorporating split-line read.

FIG. 6 shows a RAM line decoder 40" that is symmetrical, providing split-line access to either bank-0 or bank-1 by the addition of network 46'. Control line 42 functions the same as control line 41 does with respect to network 45'. Selectors 13 of network 46' select either the lower or upper inputs to selectors 13 based upon the state of the binary control signal applied to line 42. In addition, RAM 20' (bank-0) has been modified so that, like RAM 21' (bank-1) it has an additional line N (N=8, in the example of FIG. 6). This configuration allows complete flexibility in operating the cache memory. In the split-line mode, either RAM 21' or RAM 20' may be accessed at line i+1, when the line address code has a value of i. Also, when operating in the OR-line mode, complete wrap-around may be accomplished when incrementing through both RAMs by advancing from line (N–1) to line N by changing the state of control lines 41 and 42 so that the lower inputs to selectors 13 are selected when the line address value is N–1 (N–1=7, in the example of FIG. 6) causing line N (N=8 in the example) of both RAMs to be enabled. If line N is made to have the same contents as line 0, the resulting access would be the same as if a wrap-around from line (N−1) to line 0 had been made.

Figure 7:
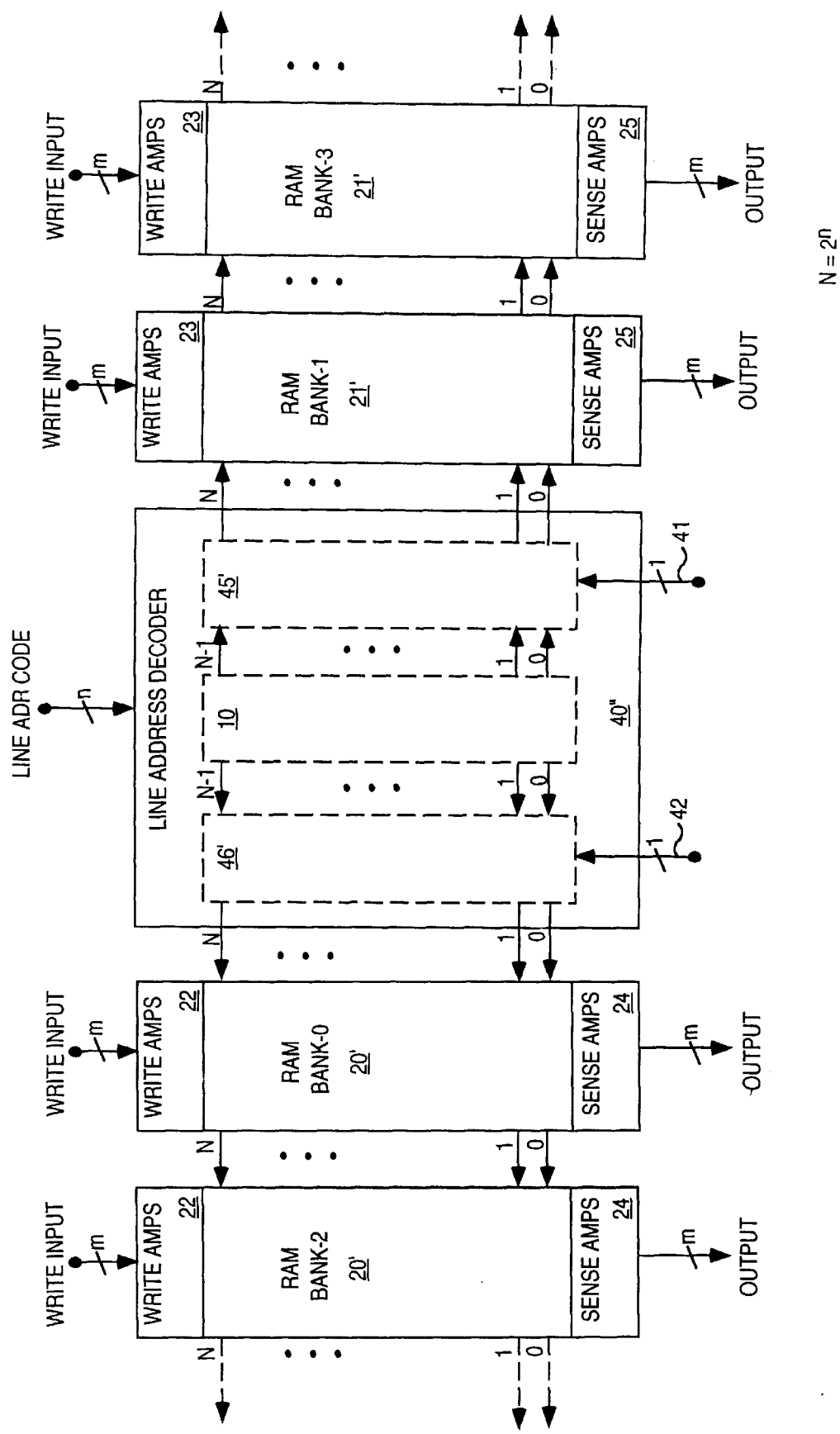
FIG. 7 is an example of a multibank memory with OR-line and split-line read.

The address decoding apparatus 40'' of FIG. 6 can be used to operate 4 or more banks as shown in FIG. 7. Line address decoder 40''', essentially as shown in FIG. 6, accepts an n-bit line address code plus control lines 41 and 42 to provide selective activation of N+1 control lines (0, 1, ..., N), where N=2$^n$. The split-line feature for the left side RAMs 0, 2, ...) are controlled by line 42 and the right side RAMs (1, 3, ...) by line 41. All left side RAM lines are activated by the N+1 output lines of network 46' while the right side RAMs are activated by the N+1 output line of network 45'. OR-line wrap-around from line (−1) to line 0 is accomplished for all RAM banks by incrementing all banks by advancing form line (N−1) to line N by charging the state of control lines 41 and 42 as previously described with respect to FIG. 6.

FIG. 8 is a truth table showing the relationship between the line address code applied to decoder 40;, the state of mode control line 41 or 42, and the state of the (N+1) decoded memory line select control liens generated by decoder 40'. The line index code n and either mode control line 41 and 42, designated as a "c"-bit in the first three columns of FIG. 8 represent all possible states of the input control signals (a 3-bit line index code is assumed in the example. The state of the N+1=9 decoded memory-line-select control lines are shown in the 9 right-hand columns where a "1" represents an active output state for enabling a memory access to its corresponding RAM line and the absence of a "1" indicates the inactive logic state.

From FIG. 8 it is clear that the OR-line mode is achieved by having the mode control bit C=0; the incremented-by-one mode for split-line operation is achieved by having mode control bit C=1, and the wrap-around operation is achieved by activating the mode control C-bit (C=1) after accessing line N−1 (line 7 of the example).

What is claimed is:

1. An apparatus to provide access to at least two storage devices, comprising:

a decoding circuit having N output lines; and a split-line circuit, coupled to the decoding circuit, the split-line circuit comprising (N+1) select circuits, the (N+1) select circuits each having an input coupled to at least one of the N output lines, the (N+1) select circuits each having an output coupled to a first of said at least two storage devices to access data stored therein.

2. The apparatus of claim 1, wherein the first of said at least two storage devices comprises (N+1) data lines, and wherein a first and an (N+1)th data line of the first storage device store the same data.

3. In a system comprising a first storage area, a second storage area, and an address decoding unit coupled between the first and the second storage areas, a method for accessing at least one of the first and second storage areas, comprising the steps of:

decoding a set of N address lines in the address decoding unit to generate (N+1) select lines; and accessing a first data line of one of the first and the second storage areas with said (N+1) select signals.

4. The method of claim 3, further comprising the step of:

storing a value at the first data line and at a (N+1)th data line in the one of the first and second storage areas coupled to the set of (N+1) select lines.

5. A memory system that is capable of operating in either an OR-line mode or a split-line mode, comprising:

(a) a decoding circuit having N output lines;

(b) a first split-line circuit coupled to said decoding circuit, each of said split-line circuits having (N+1) select circuits, each of said (N+1) select circuits having a first input, a second input and a control input wherein each of said (N+1) select circuits selects one of said first input and said second inputs in response to a control signal received at said control input, wherein a first input of a first select circuit is coupled to a first output line and a second input of said first select circuit is coupled to ground, and a first input of a second through an Nth select circuit is respectively coupled to a second through an Nth output line and a second input of said second through said Nth select circuit is respectively coupled to said first through an (N−1)th output line, and a first input of an (N+1)th select circuit is coupled to ground and a second input of said (N+1)th select circuit is coupled to said Nth output line;

(c) a first memory bank coupled to said decoding circuit, said first memory bank having N data lines; and (d) a second memory bank coupled to said first split-line circuit, said second memory bank having (N+1) data lines wherein a first and an (N+1)th data line in said second memory bank store the same data.

6. The system of claim 5, wherein said first split-line circuit includes a first control line, said first control line is coupled to said control input of each of said (N+1) select circuits in said first split-line circuit, said first control line having either a first logic state or a second logic state wherein said first control line having said first logic state selects said first input of each of said (N+1) select circuits in said first split-line circuit and said first control line having said second logic state selects said second input of each of said (N+1) select circuits in said first split-line circuit.

7. The system of claim 6, wherein said decoding circuit further includes a plurality of address lines coupled to said N output lines wherein said plurality of address lines receive a plurality of address signals and said decoding circuit activates one of said N output lines in response to said plurality of address signals, said activated output line accesses a data line from each of said first memory bank and said second memory bank, wherein an activated one of a first through an Nth output line respectively accesses one of a first through Nth data line in said first memory bank and one of a second through said (N+1)th data line in said second memory bank when said first control line is at said first logic state, and wherein said activated one of said first through said Nth output line respectively accesses one of said first through said Nth data line in said first memory bank and one of said first through an Nth data line in said second memory bank when said first control line is at said second logic state.

8. A memory system that is capable of operating in either an OR-line mode of operation or a split-line mode of operation, comprising:

(a) a decoding circuit having N output lines;

(b) a first and a second split-line circuit coupled to said decoding circuit, each of said split-line circuits having (N+1) select circuits, each of said (N+1) select circuits having a first input, a second input and a control input wherein each of said (N+1) select circuits selects one of said first input and said second input in response to a control signal received at said control input, wherein a first input of a first select circuit is coupled to a first output line and a second input of said first select circuit is coupled to ground, and a first input of a second through an Nth select circuit is respectively coupled to a second through an Nth output line and a second input of said second through said Nth select circuit is respectively coupled to said first through an (N−1)th output line, and a first input of an (N+1)th select circuit is coupled to ground and a second input of said (N+1)th select circuit is coupled to said Nth output line;

(c) a first memory bank coupled to said first split-line circuit, said first memory bank having (N+1) data lines wherein a first and an (N+1)th data line in said first memory bank store the same data; and (d) a second memory bank coupled to said second split-line circuit, said second memory bank having (N+1) data lines wherein a first and an (N+1)th data line in said second memory bank store the same data.

9. The memory system of claim 8, wherein said first memory bank includes a first plurality of memory banks and said second memory bank includes a second plurality of memory banks.

10. The system of claim 8, wherein said first split-line circuit includes a first control line, said first control line is coupled to said control input of each of said (N+1) select circuits in said first split-line circuit, said first control line having either a first logic state or a second logic state wherein said first control line having said first logic state selects said first input of each of said (N+1) select circuits in said first split-line circuit and said first control line having said second logic state selects said second input of each of said (N+1) select circuits in said first split-line circuit, and wherein said second split-line circuit includes a second control line, said second control line is coupled to said control input of each of said (N+1) select circuits in said second split-line circuit, said second control line having either a first logic state or a second logic state wherein said second control line having said first logic state selects said first input of each of said (N+1) select circuits in said second split-line circuit and said second control line having said second logic state selects said second input of each of said (N+1) select circuits in said second split-line circuit.

11. The system of claim 10, wherein said decoding circuit further includes a plurality of address lines coupled to said N output lines wherein said plurality of address lines receive a plurality of address signals and said decoding circuit activates one of said N output lines in response to said plurality of address signals, said activated output line accesses a memory line from each of said first memory bank and said second memory bank, wherein an activated one of a first through an Nth output line respectively accesses one of said first through an Nth data line in said first memory bank and one of a second through said (N+1)th data line in said second memory bank when said first control line is at said said second logic state and said second control line is at said first logic state, and wherein said activated one of said first through said Nth output line respectively accesses one of a second through said (N+1)th data line in said first memory bank and one of said first through an Nth data line in said second memory bank when said first control line is at said first logic state and said second control line is at said second logic state.

12. A memory line decoder for a memory system having at least two memory banks, comprising:

(a) a decoding circuit having N output lines; and (b) at least one split-line circuit coupled to said decoding circuit, each of said split-line circuits having (N+1) select circuits, each of said (N+1) select circuits having a first input, a second input and a control input wherein each of said (N+1) select circuits selects one of said first input and said second input in response to a control signal received at said control input, wherein a first input of a first select circuit is coupled to a first output line and a second input of said first select circuit is coupled to a first voltage conduit, and a first input of a second through an Nth select circuit is respectively coupled to a second through an Nth output line and a second input of said second through said Nth select circuit is respectively coupled to said first through an (N−1)th output line, and a first input of an (N+1)th select circuit is coupled to said first voltage conduit and a second input of said (N+1)th select circuit is coupled to said Nth output line.

13. The memory line decoder of claim 12, wherein each of said (N+1) select circuits includes a two-input multiplexer circuit.

14. The memory line decoder of claim 12, wherein each of said memory banks includes a random access memory (RAM) bank.

15. The memory line decoder of claim 12, wherein said first voltage conduit is at ground.

16. The memory line decoder of claim 12, wherein a first split-line circuit includes a first control line, said first control line is coupled to said control input of each of said (N+1) select circuits in said first split-line circuit, said first control line having either a first logic state or a second logic state wherein said first control line having said first logic state selects said first input of each of said (N+1) select circuits in said first split-line circuit and said first control line having said second logic state selects said second input of each of said (N+1) select circuits in said first split-line circuit.

17. The memory line decoder of claim 16, wherein said decoding circuit further includes a plurality of address lines coupled to said N output lines wherein said plurality of address lines receive a plurality of address signals and said decoding circuit activates one of said N output lines in response to said plurality of address signals, said activated output line accesses a data line from each of a first memory bank having N data lines and a second memory bank having (N+1) data lines, wherein a first and an (N+1)th data line in said second memory bank store the same data.

18. The memory line decoder of claim 16, wherein a second split-line circuit includes a second control line, said second control line is coupled to said control input of each of said (N+1) select circuits in said second split-line circuit, said second control line having either a first logic state or a second logic state wherein said second control line having said first logic state selects said first input of each of said (N+1) select circuits in said second split-line circuit and said second control line having said second logic state selects said second input of each of said (N+1) select circuits in said second split-line circuit.

19. The memory line decoder of claim 18, wherein said decoding circuit further includes a plurality of address lines coupled to said N output lines wherein said plurality of address lines receive a plurality of address signals and said decoding circuit activates one of said N output lines in response to said plurality of address signals, said activated output line accesses a memory line from each of a first memory bank having (N+1) data lines and a second memory bank having (N+1) data lines, wherein a first and an (N+1)th data line in said first memory bank store the same data and a first and an (N+1)th data line in said second memory bank store the same data.

20. The memory line decoder of claim 19, wherein said first memory bank includes a first plurality of memory banks.

21. The memory line decoder of claim 20, wherein said second memory bank includes a second plurality of memory banks.

* * * * *